United States Patent
Inumiya et al.

[11] Patent Number: 6,017,809
[45] Date of Patent: Jan. 25, 2000

[54] METHOD OF MANUFACTURING SEMICONDUCTOR DEVICE

[75] Inventors: Seiji Inumiya, Tokyo; Yoshio Ozawa, Yokohama, both of Japan

[73] Assignee: Kabushiki Kaisha Toshiba, Kawasaki, Japan

[21] Appl. No.: 08/988,221

[22] Filed: Dec. 10, 1997

[30] Foreign Application Priority Data

Dec. 11, 1996 [JP] Japan .................................. 8-330762

[51] Int. Cl.⁷ .............................................. H01L 21/3205
[52] U.S. Cl. ........................... 438/585; 438/592; 438/595
[58] Field of Search .................................... 438/163, 592, 438/593, 594, 585, 595, 682, 683, 669

[56] References Cited

U.S. PATENT DOCUMENTS

| | | | |
|---|---|---|---|
| 5,470,771 | 11/1995 | Fujii et al. | 438/594 |
| 5,512,502 | 4/1996 | Ootsuka et al. | 438/592 |
| 5,637,514 | 6/1997 | Jeng et al. | 438/163 |
| 5,639,679 | 6/1997 | Muramatu | 438/593 |
| 5,814,543 | 9/1998 | Nishimoto et al. | 438/592 |

FOREIGN PATENT DOCUMENTS

| | | |
|---|---|---|
| 4-266031 | 9/1992 | Japan . |
| 7-66408 | 3/1995 | Japan . |
| 7-183513 | 7/1995 | Japan . |

*Primary Examiner*—John F. Niebling
*Assistant Examiner*—Walter L. Lindsay, Jr.
*Attorney, Agent, or Firm*—Finnegan, Henderson, Farabow, Garrett & Dunner, L.L.P.

[57] ABSTRACT

A method of manufacturing a semiconductor device comprises the steps of forming a gate insulating film and a first silicon film on a semiconductor substrate, forming on the first silicon film a conductive film selected from the group consisting of a metal film and a metal silicide film, patterning the conductive film and the first silicon film, thereby forming a gate electrode, forming a second silicon film on a surface of the gate electrode, and carrying out a heat treatment at temperatures of 950° C. or above for increasing the radius of curvature of a lower end portion of the gate electrode or increasing the thickness of the gate insulating film under the lower end portion of the gate electrode, and repairing defects in the gate insulating film.

29 Claims, 7 Drawing Sheets

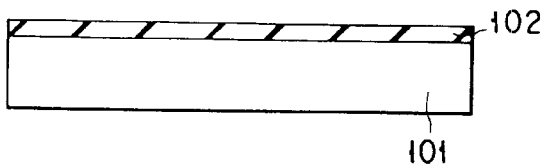
FIG. 1A
PRIOR ART
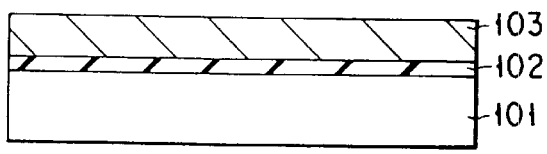
FIG. 1B
PRIOR ART
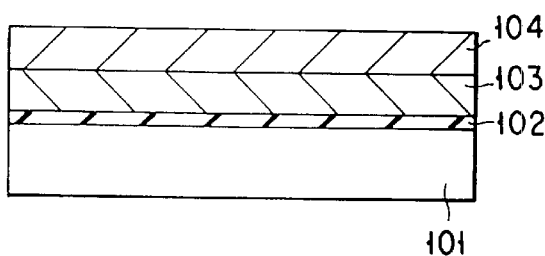
FIG. 1C
PRIOR ART
FIG. 1D
PRIOR ART
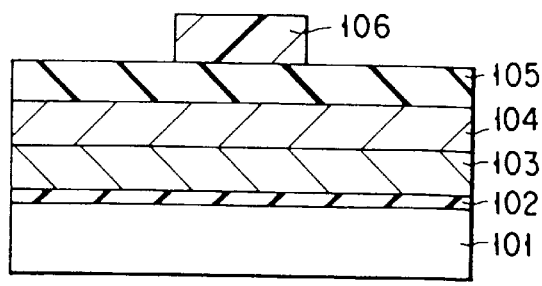
FIG. 1E
PRIOR ART
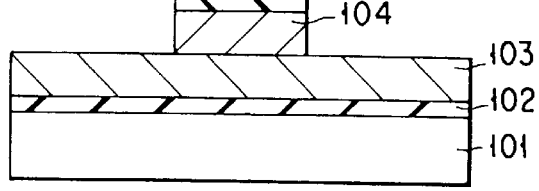
FIG. 1F
PRIOR ART
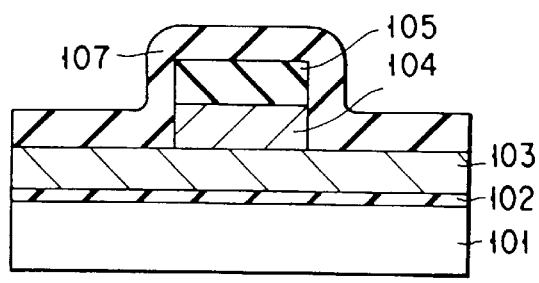
FIG. 1G
PRIOR ART
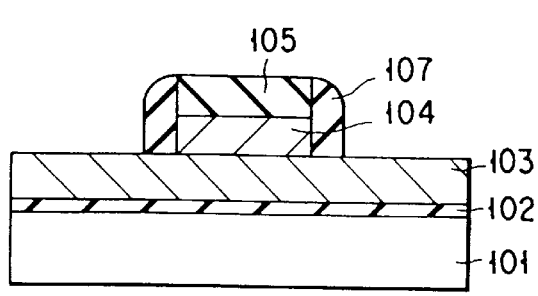
FIG. 1H
PRIOR ART
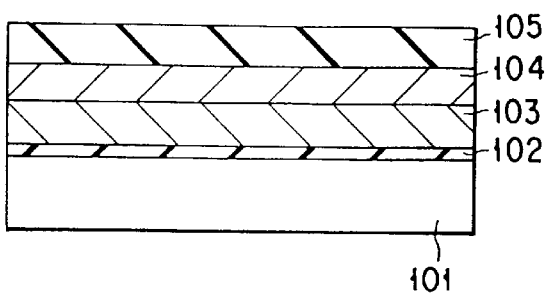

METHOD OF MANUFACTURING SEMICONDUCTOR DEVICE

BACKGROUND OF THE INVENTION

The present invention relates to a method of manufacturing a semiconductor device, wherein a metal or a metal silicide film is used as a gate electrode material.

In a semiconductor integrated circuit device having a MOS transistor, a refractory metal or a refractory metal silicide is used, in some cases, as at least part of the material constituting a gate electrode, thereby to prevent an increase in wiring resistance due to miniaturization. On the other hand, in order to relax concentration of electric field at a lower end portion of the gate electrode of the MOS transistor and to repair defects at end portion of a gate insulating film caused by patterning of the gate electrode and ion implantation for formation of source/drain regions, the lower end portion of the gate electrode and the end portion of the gate insulating film need to be subjected to a heat treatment (so-called "side-wall oxidation") in an oxidizing atmosphere.

In the case where a refractory metal or a refractory metal silicide is used as at least part of the material constituting a gate electrode, if the aforementioned heat treatment is conducted with the refractory metal or refractory metal silicide being exposed, the performance of the device is degraded due to formation of a refractory metal oxide accompanied by degradation of a surface morphology. With reference to the accompanying drawings, a description will now be given of prior art (Japanese Patent Application No. 5-327290) of the means for solving this problem of formation of a refractory metal oxide accompanied by degradation of a surface morphology and effectively supplying an oxidizing agent to the lower end portion of the gate electrode and the end portion of the gate insulating film.

At first, as shown in FIG. 1A, a gate insulating film 102 is formed on a semiconductor substrate 101 by means of thermal oxidation. Then, as shown in FIG. 1B, a conductive polysilicon film 103 is formed by means of LPCVD (Low-Pressure Chemical Vapor Deposition) and ion implantation. Using DC magnetron sputtering techniques, a tungsten silicide film 104 is formed on the conductive polysilicon film 103, as shown in FIG. 1C. Subsequently, as shown in FIG. 1D, a silicon nitride film 105 is formed on the tungsten silicide film 104 by means of LPCVD.

A photoresist is coated on the silicon nitride film 105, and the photoresist film is patterned by means of photoetching. A photoresist pattern 106 is thus formed, as shown in FIG. 1E. Using the photoresist pattern 106 as a mask, the silicon nitride film 105 is patterned by dry etching. The patterned silicon nitride film 105 is then used as a mask, and the tungsten silicide film 104 is selectively removed by dry etching, as shown in FIG. 1F.

A silicon nitride film 107 is deposited on the entire surface of the resultant structure by means LPCVD, as shown in FIG. 1G, and then the silicon nitride film 107 is etched back. Thus, a side wall film 107 of silicon nitride is formed, as shown in FIG. 1H. Using the side wall film 107 and the silicon nitride film 105 on tungsten silicide 104 as masks, the polysilicon film 103 is patterned by means of dry etching, and a structure as shown in FIG. 2 is obtained.

The structure shown in FIG. 2 is subjected to heat treatment in an oxidizing atmosphere, whereby the shape of the lower end portion of the polysilicon film 103 is improved and the defects at the gate end portion of gate insulating film 102 are repaired without causing the oxidation of the high-melting-point silicide film 104 covered with silicon nitride side-wall film 107 and silicon nitride film 105, which is accompanied by degradation of a surface morphology.

Japanese Patent Application No. 6-195810 discloses that a refractory metal film, other than the aforementioned refractory metal silicide film, is used, and a silicon nitride oxide film, a polysilicon film, a single-crystal silicon film or an amorphous silicon film, other than the aforementioned silicon nitride film, is used as the oxidation prevention film.

With this technique, the gate edge characteristics can be improved without causing formation of a refractory metal oxide accompanied by degradation of a surface morphology. However, this method has the following drawbacks:

1) It is necessary to form the oxidation prevention film 105 by means of LPCVD, suspend the patterning of the gate electrode, form the oxidation prevention film 107 by means of LPCVD, and etch back the entire surface of the resultant structure. Thus, the manufacturing cost is increased due to an increase in the number of manufacturing steps, and the time period of manufacture is increased accordingly.

2) Only a transistor, which is as large as double the thickness of the side-wall film 107, as compared to minimum patterning dimensions, can be manufactured. This prevents the integration density and operation speed from being increased.

3) A step of the total-surface etch-back, with which dimensional controllability is low, is required. Thus, the variance in operational characteristics of transistors increases.

4) If the silicon nitride film and silicon films are used as the oxidation prevention film 105 and side-wall film 107, there is a large difference in thermal expansion coefficient between these films and the material of the gate electrode. In addition, a stress is produced by the volume expansion due to oxidation. Consequently, the electrical reliability of the gate insulating film 102 deteriorates, and film removal occurs at the interface between the polysilicon film 103 and the refractory metal film or refractory metal silicide film 104.

5) If boron is used as impurities for providing the polysilicon film 103 with electrical conductivity and if the silicon nitride films are used as oxidation prevention film 105 and side-wall film 107, boron in the polysilicon film 103 penetrates the gate insulating film 102 and diffuses into the semiconductor substrate 101. Consequently, the electrical reliability of the gate insulating film 102 and the operational characteristics of the transistor are degraded.

6) Since the upper surface of the refractory metal film is covered with the non-conductive film, a hole for contact with the gate electrode needs to be formed to such a degree as to expose the upper surface of the refractory metal film. Thereafter, a washing treatment with use of an acid solution cannot be performed. Moreover, an excess amount of etching of the gate electrode film increases in a step of simultaneously forming contact holes for contact with the semiconductor substrate and the gate electrode.

BRIEF SUMMARY OF THE INVENTION

The object of the present invention is to provide a method of manufacturing a highly reliable semiconductor device.

According to the present invention, there is provided a method of manufacturing a semiconductor device, the method comprising the steps of:

forming a gate insulating film and a first silicon film on a semiconductor substrate;

forming on the first silicon film a conductive film selected from the group consisting of a metal film and a metal silicide film;

patterning the conductive film and the first silicon film, thereby forming a gate electrode;

forming a second silicon film on a surface of the gate electrode; and carrying out a heat treatment for increasing the radius of curvature of a lower end portion of the gate electrode or increasing the thickness of the gate insulating film under the lower end portion of the gate electrode, and repairing defects in the gate insulating film.

This invention also provides a method of manufacturing a semiconductor device, the method comprising the steps of:

forming a gate insulating film and a first silicon film on a semiconductor substrate;

forming on the first silicon film a conductive film selected from the group consisting of a metal film and a metal silicide film;

patterning the conductive film and the first silicon film, thereby forming a gate electrode;

forming a silicon oxide film on an exposed surface of the first silicon film of the gate electrode;

forming a second silicon film on a surface of the conductive film and a surface of the silicon oxide film; and carrying out a heat treatment for increasing the radius of curvature of a lower end portion of the gate electrode or increasing the thickness of the gate insulating film under the lower end portion of the gate electrode, and repairing defects in the gate insulating film.

This invention also provides a method of manufacturing a semiconductor device, the method comprising the steps of:

forming a gate insulating film and a first silicon film on a semiconductor substrate;

forming on the first silicon film a conductive film selected from the group consisting of a metal film and a metal silicide film;

forming on the conductive film a silicon oxide film or a metal silicide film;

selectively etching the silicon oxide film or the metal silicide film, and the conductive film, thereby forming a gate electrode;

forming a silicon oxide film or a metal silicide film on a side wall of the gate electrode;

selectively etching the first silicon film by using the silicon oxide film or the metal silicide film as a mask; and carrying out a heat treatment for increasing the radius of curvature of a lower end portion of the gate electrode or increasing the thickness of the gate insulating film under the lower end portion of the gate electrode, and repairing defects in the gate insulating film.

This invention also provides a method of manufacturing a semiconductor device, the method comprising the steps of:

forming on a semiconductor substrate a gate insulating film and a conductive film containing a conductor selected from the group consisting of a metal and a metal silicide;

patterning the conductive film, thereby forming a gate electrode;

forming a silicon film on a surface of the gate electrode; and carrying out a heat treatment for increasing the radius of curvature of a lower end portion of the gate electrode or increasing the thickness of the gate insulating film under the lower end portion of the gate electrode, and repairing defects in the gate insulating film.

According to the present invention, there is also provided a semiconductor device comprising a semiconductor substrate; a gate insulating film formed on the semiconductor substrate; and a gate electrode formed on the gate insulating film, wherein at least part of the gate electrode is formed of a metal film or a metal silicide film, a conductive film with acid resisting properties is formed on a surface of the metal film or metal silicide film, and the conductive film with acid resisting properties is not provided on the gate insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 1A to 1H are cross-sectional views illustrating steps of manufacturing a conventional semiconductor device;

DETAILED DESCRIPTION OF THE INVENTION

Figure 2:
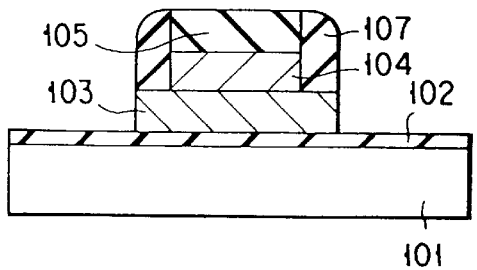
FIG. 2 is a cross-sectional view showing a step of manufacturing the conventional semiconductor device.

The present invention will now be described in greater detail.

The present invention is characterized in that in the state in which an exposed surface of a metal film or a metal silicide film constituting a gate electrode is covered with a silicon film, a metal silicide film or a silicon oxide film, a heat treatment is performed to increase the radius of curvature of a lower end portion of the gate electrode or increase the thickness of a gate insulating film under the lower end portion of the gate electrode, and to repair defects in the gate insulating film. Thereby, oxidation of the metal film or metal silicide film constituting the gate electrode, which is accompanied by degradation of a surface morphology, can be suppressed.

In a case where not only the exposed surface of the metal film or metal silicide film but also the entire surface of the structure is provided with a silicon film or a metal silicide film, the heat treatment needs to be performed in an oxidizing atmosphere, thereby to oxidize the silicon film or metal silicide film and to repair defects in the gate insulating film. The oxidizing atmosphere is, for example, an atmosphere containing oxygen, ozone and water vapor. In particular, an atmosphere containing dry oxygen is preferable.

Where a dry oxygen atmosphere is used, the temperature for heat treatment is, preferably, 950° C. or above, and more preferably 950 to 1,100° C. The reliability of the gate section may deteriorate at temperatures of less than 950° C.

It is preferable that the heat treatment is performed under such a selective oxidatior condition that the rate of oxidation reaction with silicon is higher than that of reduction reaction therewith, and the rate of oxidation reaction with a metal is lower than that of reduction reaction therewith.

In the present invention, a metal or a metal silicide constituting the gate electrode may be a metal such as tungsten, molybdenum or a titanium or a silicide thereof. The silicon film may be an amorphous silicon film, a polysilicon film or a single crystal silicon film.

The above-described method of manufacturing the semiconductor device of the present invention has the following advantages in addition to the advantage in that abnormal oxidation of the metal film or metal silicide film constituting the gate electrode, which is accompanied by degradation of a surface morphology, can be suppressed.

Unlike the conventional technique, two-stage gate electrode patterning steps are not required, and thus the number of steps can be reduced. A transistor can be manufactured with minimum patterning dimensions, and high integration density can be achieved. A step of the total-surface etch-back, with which dimensional controllability is low, is not required. Thus, the variance in operational characteristics of transistors does not increase.

Since the silicon nitride film is not. used as oxidation prevention film, the reliability of the gate insulating film does not deteriorate due to stress, and degradation of operational characteristics of transistors can be prevented. In addition, penetration of boron into the semiconductor substrate, which is generally considered to be accelerated by hydrogen, can be suppressed, and variance in operational characteristics of transistors can be prevented.

Furthermore, since the surface of metal is not exposed after the contact hole is formed, a washing treatment with use of an acid solution can be performed. Besides, an excess etching of the metal of the gate electrode is prevented in a step of simultaneously forming contact holes for contact with the surface of the semiconductor substrate and the gate electrode.

Embodiments of the present invention will now be described with reference to the accompanying drawings.

First Embodiment

Figure 3E:
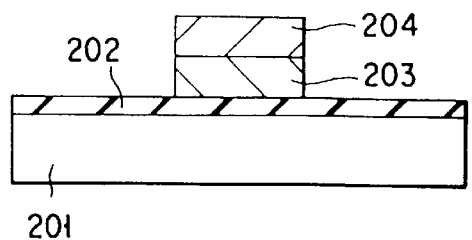
FIGS. 3A to 3H are cross-sectional views illustrating steps of manufacturing a semiconductor device according to a first embodiment of the present invention.
Figure 3A:
Figure 3F:
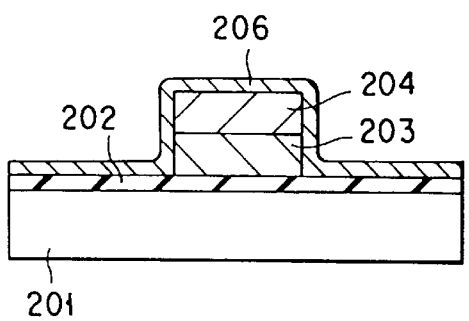
Figure 3B:
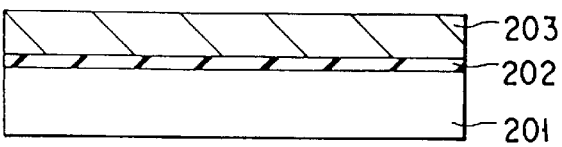

FIGS. 3A to 3H are cross-sectional views illustrating the steps of a method of manufacturing a MOS type semiconductor device according to a first embodiment of the present invention. As is shown in FIG. 3A, a silicon oxide film 202 with a thickness of 6 nm is formed by thermal oxidation on a flattened surface of a silicon substrate 201. A polysilicon film 203 with a thickness of 150 nm is deposited on the silicon oxide film 202 by means of LPCVD with use of monosilane as raw material gas. Subsequently, boron (B) is ion-implanted as impurities and thus a first conductivity-type polysilicon film 203 is formed, as shown in FIG. 3B. The impurities may be introduced by means of thermal diffusion, and donors such as phosphorus (P) or arsenic (As) may be used as impurities.

Figure 3G:
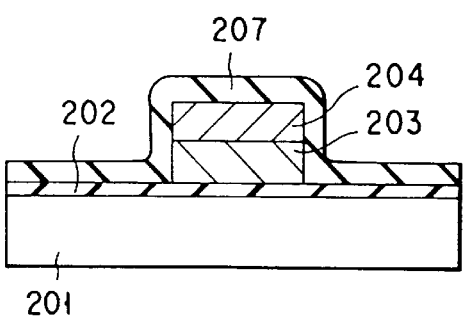
Figure 3C:
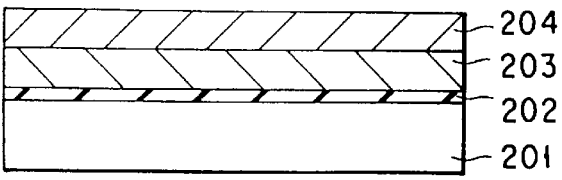

A tungsten silicide film 204 with a thickness of 200 nm is deposited by means of sputtering, as shown in FIG. 3C. Then, as shown in FIG. 3D, a photoresist is applied to the tungsten silicide film 204 and the photoresist is patterned by means of photolithography. Thus, a resist pattern 205 is formed.

Using the resist pattern 205 as a mask, the tungsten silicide film 204 and conductive polysilicon film 203 are patterned by dry etching in a self-alignment manner and the resist pattern 205 is removed by an ashing method, as shown in FIG. 3E.

Subsequently, as shown in FIG. 3F, an amorphous silicon film 206 with a thickness of 10 nm is deposited by means of LPCVD with use of monosilane end phosphine as raw material gas. The amorphous silicon film 206 may be replaced with a polysilicon film or a single-crystal silicon film. The deposited amorphous silicon film 206 is oxidized by thermal oxidation using dry oxygen, and a silicon oxide film 207 is formed, as shown in FIG. 3G. This thermal oxidation needs to be performed to the point beyond the side face of the conductive polysilicon film 203. The temperatures for the oxidation should, preferably, be high temperatures and 950° C. or above, in order to increase the radius of curvature of the lower end portion of the gate electrode and to repair defects in the gate insulating film in a short time period. The step of this oxidation may be performed, following subsequent formation of source/drain regions 208.

Figure 3H:
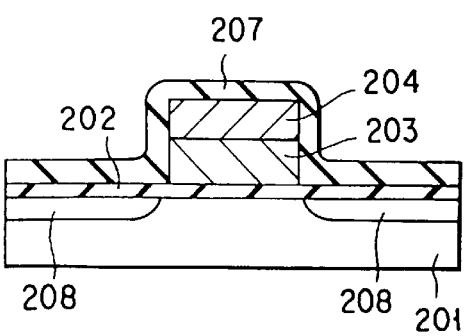
Figure 3D:
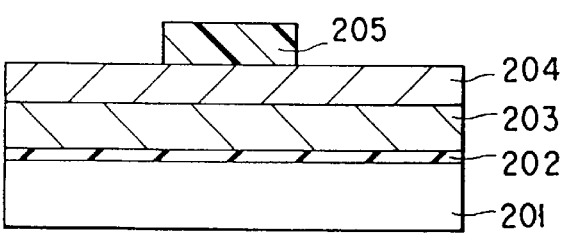

Thereafter, as shown in FIG. 3H, impurities are introduced by means of ion implantation in the silicon substrate in a self-alignment manner, thereby forming a source region 208a and a drain region 208b. Further, the impurities are activated by a lamp annealing method. At last, an interlayer insulating film, a metal wiring layer, etc., not shown, are formed, and a MOS type semiconductor device is fabricated.

As has been described above, in the MOS type semiconductor device according to the first embodiment, the surface of the tungsten silicide film 204 is covered with the silicon oxide film 207 at the time of beginning the improvement in shape of the lower end portion of the conductive polysilicon film 203 and the repair of defects in the gate end portion of the gate insulating film 202. Thus, the rate of oxidation is lowered and formation of a refractory metal oxide accompanied by degradation of a surface morphology is suppressed at the time of side-wall oxidation.

The method according to the first embodiment is applied to a case where a metallic material such as tungsten is used as gate electrode material. In such a case, it is preferably to perform oxidation under such a selective oxidation condition that silicon is oxidized while a metal is hardly oxidized. In this case, too, formation of a refractory metal oxide accompanied by degradation of a surface morphology can be suppressed because of the decrease in oxidation rate of the metallic material. The selective oxidation condition is, for example, a water vaporous atmosphere containing hydrogen with high partial pressure. The ratio of the partial pressure of water vapor to that of hydrogen ($PH_2O/PH_2$) should, preferably, be about 0.01 to 0.4.

Unlike the conventional technique, two-stage gate electrode patterning steps are not required, and thus the number of steps can be reduced. A transistor can be manufactured with minimum patterning dimensions, and high integration density can be achieved. A step of the total-surface etchback, with which dimensional controllability is low, is not required. Thus, the variance in operational characteristics of transistors does not increase.

Since the silicon nitride film is not used as oxidation prevention film, the reliability of the gate insulating film does not deteriorate due to stress, and degradation of operational characteristics of transistors can be prevented. In addition, penetration of boron into the semiconductor substrate, which is generally considered to be accelerated by hydrogen, can be suppressed, and variance in operational characteristics of transistors can be prevented.

Figure 7:
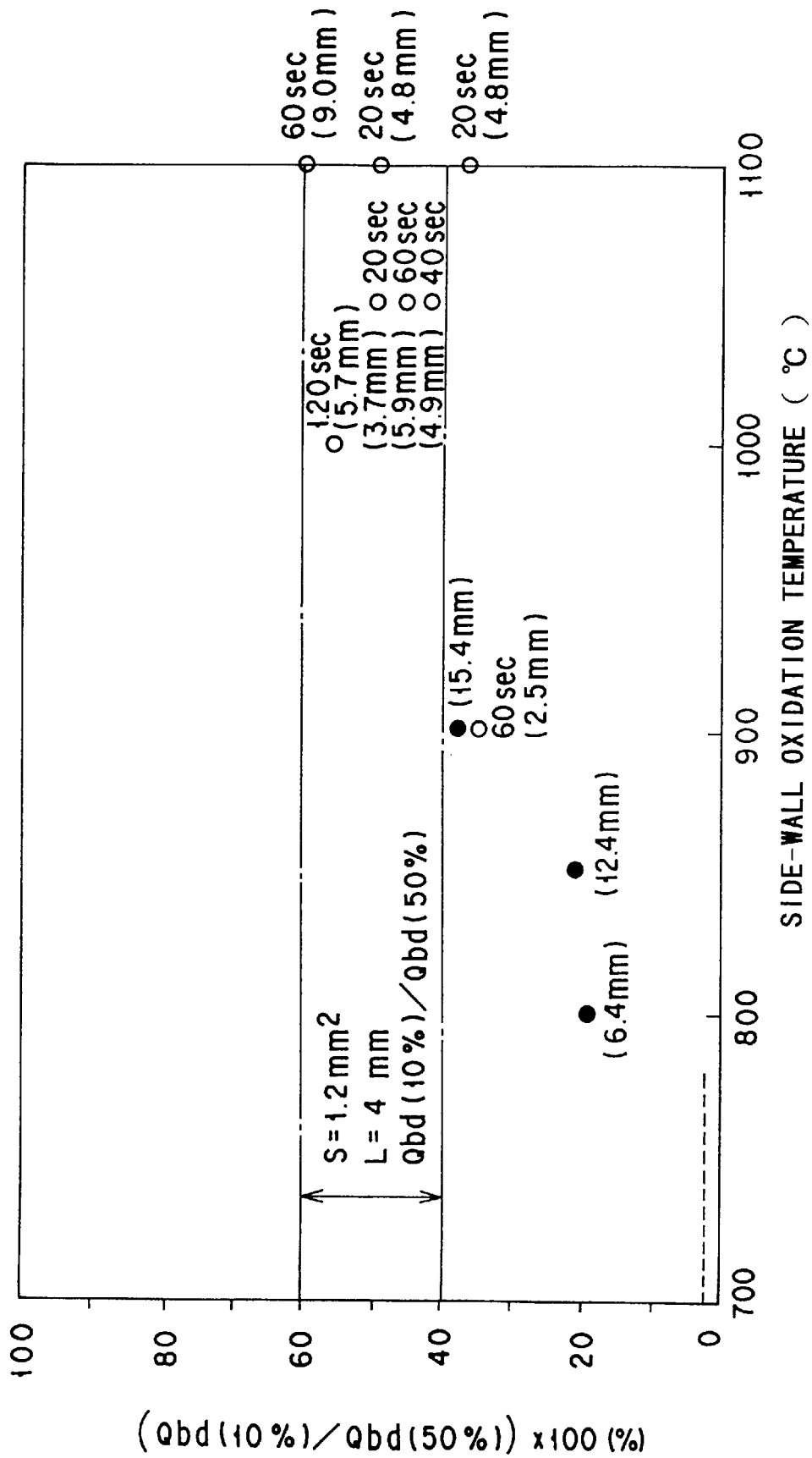
FIG. 7 is a graph showing a relationship between a side-wall oxidation temperature and Qbd(10%)/Qbd(50%) in a MOS capacitor.

The inventors conducted constant-current stress destructive tests of MOS capacitors with a gate edge length of about 2 nm which are fabricated according to the procedures of the present embodiment, except that the side-wall oxidation temperatures were varied, and measured a distribution of a breakdown life of about one hundred of samples. As a standard of frequency of accidental failure, a ratio of a time for 10% of cumulative percent defective (Qbd (10%)) to a time for 50% of cumulative percent defective (Qbd (50%)) (average life) is used. FIG. 7 shows a ratationship between the accidental failure frequency and a side-wall oxidation temperature. It is understood, from FIG. 7, that the accidental failures are less and the reliability is higher when the side-wall oxidation temperatures are 1,000° C. and 1,100° C. than when they are 800° C., 850° C. and 900° C.

Second Embodiment

Figure 4A:
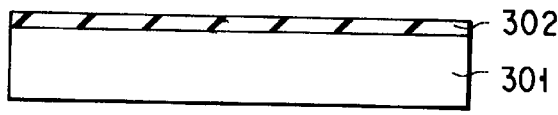
FIGS. 4A to 4K are cross-sectional views illustrating steps of manufacturing a semiconductor device according to a second embodiment of the present invention.
Figure 4E:
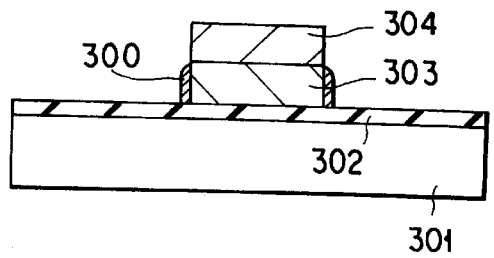
Figure 4B:
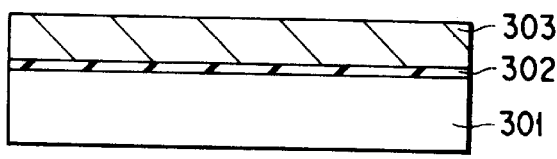

FIGS. 4A to 4K are cross-sectional views illustrating the steps of a method of manufacturing a MOS type semiconductor device according to a second embodiment of the present invention. As is shown in FIG. 4A, a silicon oxide film 302 with a thickness of 6 nm is formed by thermal oxidation on a flattened surface of a silicon substrate 301. A polysilicon film 303 with a thickness of 150 nm is deposited on the silicon oxide film 302 by means of LPCVD with use of monosilane as raw material gas. Subsequently, boron (B) is ion-implanted as impurities and thus a first conductivity-type polysilicon film 303 is formed, as shown in FIG. 4B. The impurities may be introduced by means of thermal diffusion, and donors such as phosphorus (P) or arsenic (As) may be used as impurities.

Figure 4F:
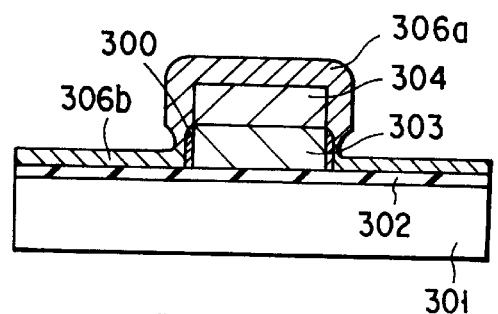
Figure 4C:
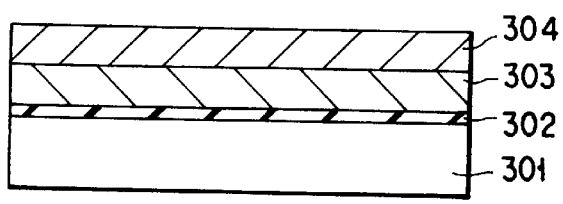

A tungsten silicide film 304 with a thickness of 200 nm is deposited by means of sputtering, as shown in FIG. 4C. Then, as shown in FIG. 4D, a photoresist is applied to the tungsten silicide film 304 and the photoresist is patterned by means of photolithography. Thus, a resist pattern 305 is formed.

Using the resist pattern 305 as a mask, the tungsten silicide film 304 and conductive polysilicon film 303 are patterned by dry etching in a self-alignment manner and the resist pattern 305 is removed by an ashing method, as shown in FIG. 4E. At this time, a natural oxidation film with a thickness of about 1 nm or less forms on exposed surfaces of the lungsten film 304 and conductive polysilicon film 303. Such a natural oxidation film is exposed to vaporous fluoric acid and removed. Then, the resultant structure is subjected to a treatment with ozone water at 25° C. and a natural oxidation film 300 about 1 nm thick is formed on the exposed surface of the conductive polysilicon film 303. Instead of the natural oxidation film 300, a thermal oxidation film may be formed. In this case, it is preferable to perform the thermal oxidation at 600° C. or below.

Following the above, as shown in FIG. 4F, a conductive polysilicon film 306a having a thickness of 10 nm is deposited on the tungsten film 304 and a conductive polysilicon film 306b having a thickness of 2 nm are deposited on the side face (natural oxidation film 300) of conductive polysilicon film 303 and on the silicon oxide film 302 by means of LPCVD using monosilane and phosphine as raw material gases. A difference in thickness between the conductive polysilicon film 306a and conductive polysilicon film 306b occurs due to the natural oxidation film 300 on the side face of conductive polysilicon film 303 and a delay time of deposition on the silicon oxide film 302. This difference in thickness can be controlled by the deposition temperature, gas flow rate, and deposition pressure.

The load-in in the deposition furnace for forming the conductive polysilicon film 306a and conductive polysilicon film 306b is conducted, preferably, at 350° C. or below in order to prevent oxidation of tungsten by an entrainment atmosphere. The conductive polysilicon film 306a and 306b may be replaced with a conductive amorphous silicon film and a conductive single-crystal silicon film.

Figure 4G:
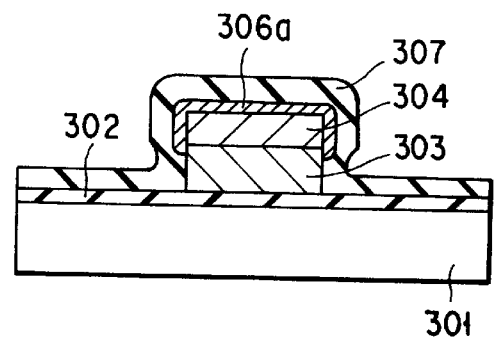
Figure 4D:
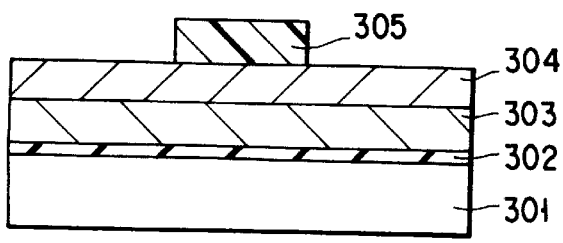

Subsequently, the conductive polysilicon film 306a and conductive polysilicon film 306b are oxidized by means of thermal oxidation using dry oxygen and, as shown in FIG. 4G, a silicon oxide film 307 is formed. The thermal oxidation needs to be carried out beyond the side face of the conductive polysilicon film 303. The oxidation temperatures should, preferably, be 950° C. or above. The oxidation may be performed after subsequent formation of a source/drain region 308. Because of a difference in film thickness, the conductive polysilicon film 306a formed on the side wall of tungsten film 304 is not entirely oxidized, and portion thereof is left, as shown in FIG. 4G.

Figure 4H:
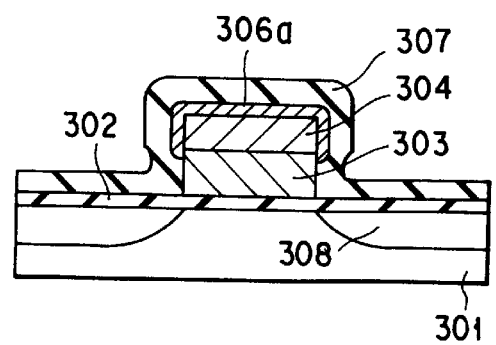
Figure 4I:
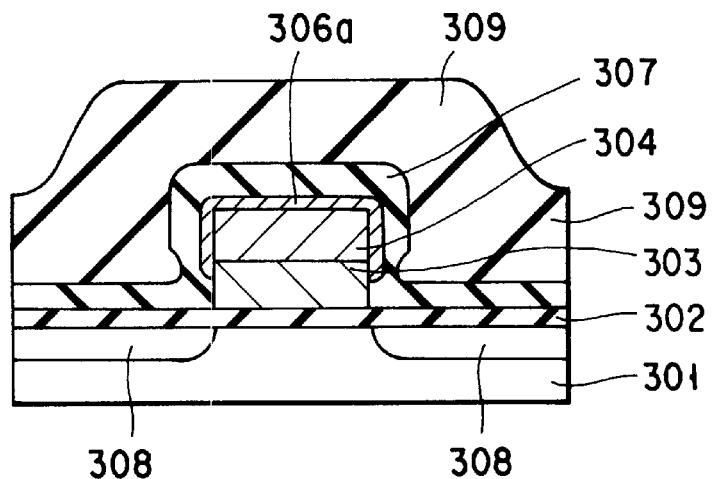
Figure 4J:
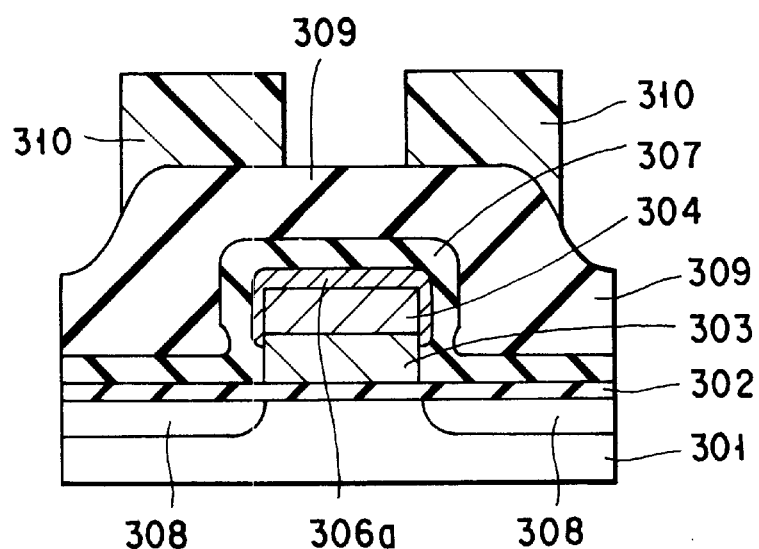

Then, as shown in FIG. 4H, a source/drain region 308 is formed in a self-alignment manner by means of ion implantation and the implanted ions are activated by a lamp annealing method. Subsequently, as shown in FIG. 4I, a silicon oxide film 309 with a thickness of 500 nm is deposited by means of LPCVD. A photoresist is applied on the silicon oxide film 309, as shown in FIG. 4J, and the photoresist is patterned by means of photolithography. Thus, a resist pattern 310 is formed.

Figure 4K:
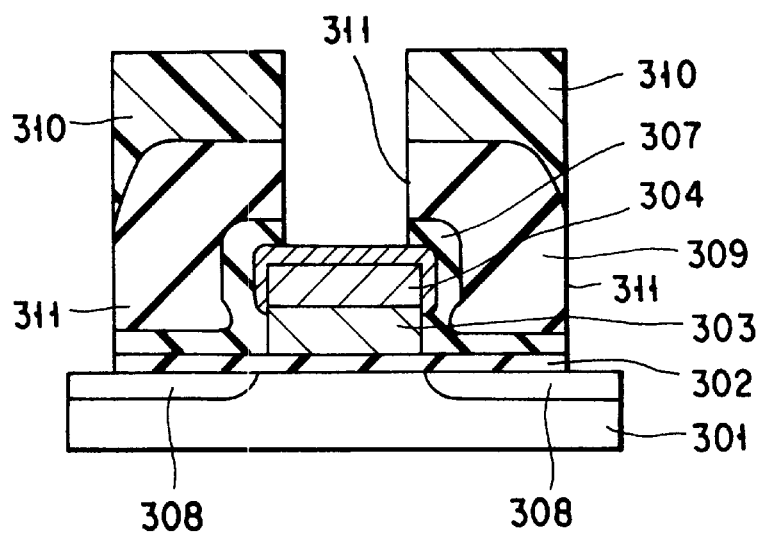

Using the resist pattern 310 as a mask, as shown in FIG. 4K, the silicon oxide film 309 is subjected to selective dry etching under such a condition that selectivity for the silicon film is high, and thus a contact hole 311 is formed. The resist pattern 310 is then removed by a wet treatment using sulfuric acid and hydrogen peroxide aqueous solution. The formation of the contact hole 311 is stopped by the conductive polysilicon film 306a, so that the surface of the tungsten film 304 may not be exposed. Thereby, an acid aqueous solution can be used to remove the resist pattern 310 subsequently.

A metal wiring layer, an interlayer insulating film, etc., not shown, are formed in a subsequent step and a MOS type semiconductor device is fabricated.

As has been described above, in the method of manufacturing the MOS type semiconductor device according to the second embodiment, the tungsten silicide film 304 is covered with the conductive polysilicon film 306a at the time of beginning the improvement in shape of the lower end portion of the conductive polysilicon film 303 and the repair of defects in the gate end portion of the gate insulating film 302. Thus, the oxidizing agent does not reach the surface of tungsten film 304 and abnormal oxidation is suppressed.

Unlike the conventional technique, two-stage gate electrode patterning steps are not required, and thus the number of steps can be reduced. A transistor can be manufactured with minimum patterning dimensions, and high integration density can be achieved. A step of the total-surface etchback, with which dimensional controllability is low, is not required. Thus, the variance in operational characteristics of transistors does not increase.

Since the silicon nitride film is not used as oxidation prevention film, the reliability of the gate insulating film does not deteriorate due to stress, and degradation of operational characteristics of transistors can be prevented. In addition, penetration of boron into the semiconductor substrate, which is generally considered to be accelerated by hydrogen, can be suppressed, and variance in operational characteristics of transistors can be prevented.

Third Embodiment

Figure 5A:
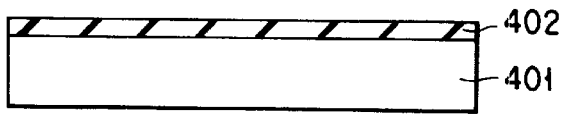
FIGS. 5A to 5H are cross-sectional views illustrating steps of manufacturing a semiconductor device according to a third embodiment of the present invention.
Figure 5E:
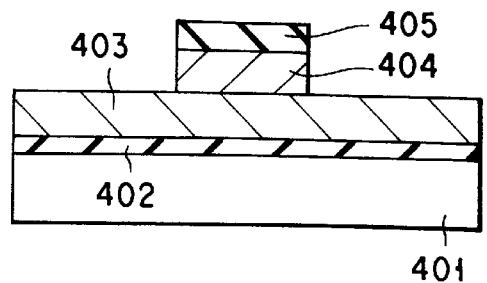
Figure 5B:
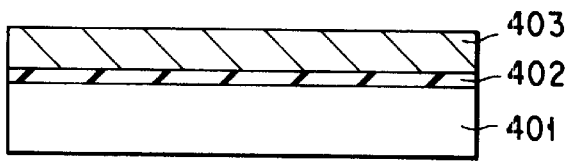

FIGS. 5A to 5H are cross-sectional views illustrating the steps of a method of manufacturing a MOS type semiconductor device according to a third embodiment of the present invention. As is shown in FIG. 5A, a silicon oxide film 402 with a thickness of 6 nm is formed by thermal oxidation on a flattened surface of a silicon substrate 401. A polysilicon film 403 with a thickness of 150 nm is deposited on the silicon oxide film 402 by means of LPCVD with use of monosilane as raw material gas. Subsequently, boron (B) is ion-implanted as impurities and thus a first conductivity-type polysilicon film 403 is formed, as shown in FIG. 5B. The impurities may be introduced by means of thermal diffusion, and donors such as phosphorus (P) or arsenic (As) may be used. as impurities.

Figure 5F:
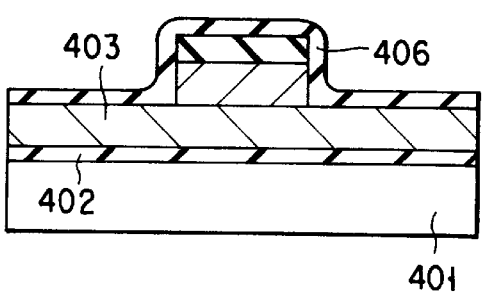
Figure 5C:
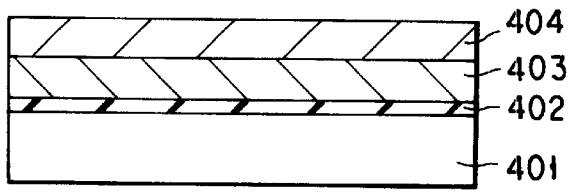

A tungsten silicide film 404 with a thickness of 200 nm is deposited by means of sputtering, as shown in FIG. 5C. Then, a silicon oxide film 405 with a thickness of 60 nm is deposited by LPCVD and, as shown in FIG. 5D, a photoresist is applied to the silicon oxide film 405 and the photoresist is patterned by means of photolithography. Thus, a resist pattern 409 is formed.

Using the resist pattern 409 as a mask, the silicon oxide film 405 and tungsten film 404 are patterned by selective dry etching and the resist pattern 409 is removed by an ashing method, as shown in FIG. 5E. A silicon oxide film 406 is deposited by LPCVD on the resultant structure, as shown in FIG. 5F. The silicon oxide film 406 may be replaced with a metal silicide film such as a tungsten silicide film.

Figure 5G:
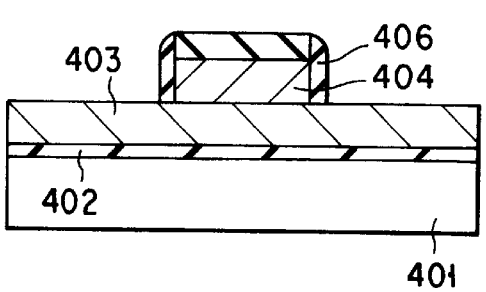
Figure 5D:
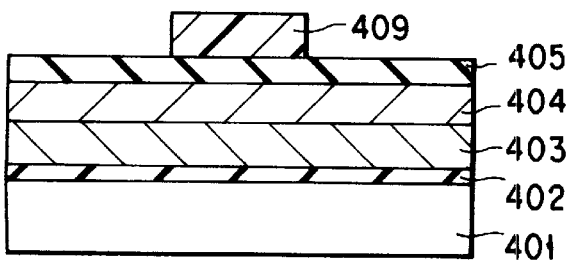

The silicon oxide film 406 is then etched back, as shown in FIG. 5G, and a side-wall film 406 is formed. Using the silicon oxide film 405 and side-wall film 406 as masks, as shown in FIG. 5H, the conductive polysilicon film 403 is selectively removed by means of dry etching.

The resultant structure is heat-treated in an oxidizing atmosphere, and the shape of a lower end portion of conductive polysilicon film 403 is improved and defects in a gate end portion of the gate insulating film 402 are repaired. This heat treatment should, preferably, be performed in a short time period. If the temperature for treatment is 950° C. or above, sufficient effect can be attained within several-ten seconds. The heat treatment may be performed after subsequent formation of a source/drain region 408.

Figure 5H:
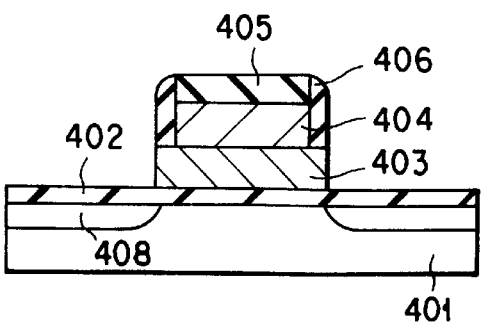

Then, as shown in FIG. 5H, a source/drain region 408 is formed in a self-alignment manner by means of ion implantation and the implanted ions are activated by a lamp annealing method. Subsequently, an interlayer insulating film, a metal wiring layer, etc., not shown, are formed in a subsequent step and a MOS type semiconductor device is fabricated.

As has been described above, in the method of manufacturing the MOS type semiconductor device according to the third embodiment, the tungsten film 404 is covered with the silicon oxide film 405 and side-wall film 406 at the time of improving the shape of the lower end portion of the conductive polysilicon film 403 and repairing defects in the gate end portion of the gate insulating film 402. Thus, the oxidizing agent does not reach the surface of tungsten film 404 in a short time period and abnormal oxidation is suppressed.

Since the silicon nitride film is not used as oxidation prevention film, the reliability of the gate insulating film does not deteriorate due to stress, and degradation of operational characteristics of transistors can be prevented. In addition, penetration of boron present in the electrode into the semiconductor substrate, which is generally considered to be accelerated by hydrogen, can be suppressed, and variance in operational characteristics of transistors can be prevented.

Furthermore, since the surface of metal is not exposed after the contact hole is formed, a washing treatment with use of an acid solution can be performed. Besides, an excess etching of the metal of the gate electrode is prevented in a step of simultaneously forming contact holes for contact with the surface of the semiconductor substrate and the gate electrode.

Fourth Embodiment

Figure 6A:
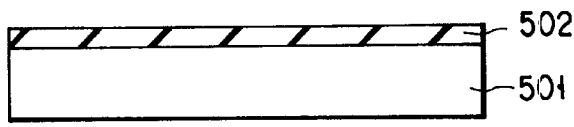
FIGS. 6A to 6G are cross-sectional views illustrating steps of manufacturing a semiconductor device according to a fourth embodiment of the present invention.
Figure 6B:
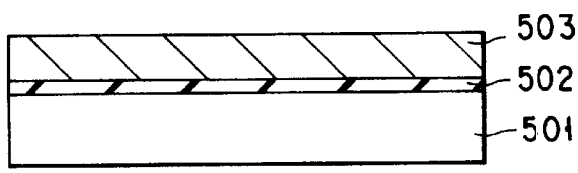

FIGS. 6A to 6G are cross-sectional views illustrating the steps of a method of manufacturing a MOS type semiconductor device according to a fourth embodiment of the present invention. As is shown in FIG. 6A, a silicon oxide film 502 with a thickness of 6 nm is formed by thermal oxidation on a flattened surface of a silicon substrate 501. A tungsten silicide film 503 with a thickness of 200 nm is then deposited by means of sputtering, as shown in FIG. 6B.

Figure 6C:
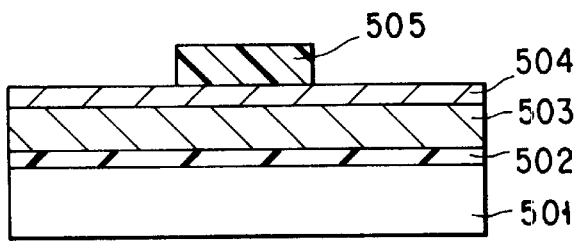
Figure 6D:
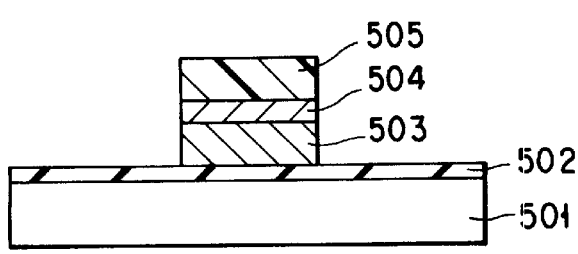

As is shown in FIG. 6C, a conductive amorphous silicon film 504 with a thickness of 10 nm is deposited on the tungsten silicide film 503 by means of LPCVD with use of monosilane and phosphine as raw material gases. A photoresist is applied to the entire surface of the amorphous silicon film 504 and the photoresist is patterned by means of photolithography. Thus, a resist pattern 505 is formed.

Figure 6E:
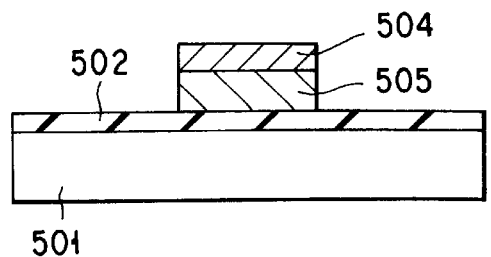

Using the resist pattern 505 as a mask, the polysilicon film 504 and tungsten silicide film 503 are patterned by dry etching in a self-alignment manner and the resist pattern 505 is removed by an ashing method, as shown in FIG. 6E.

Figure 6F:
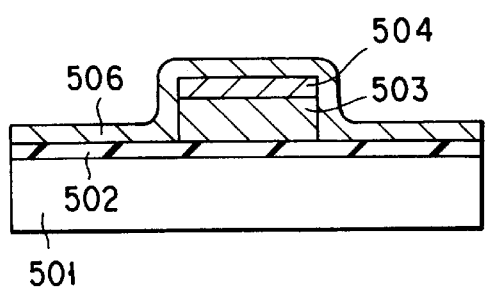
Figure 6G:
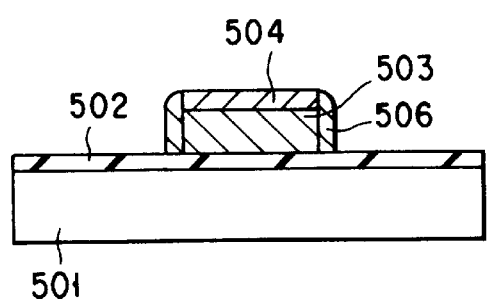

Subsequently, an amorphous silicon film 506 with a thickness of 10 nm is deposited by LPCVD on the resultant structure, as shown in FIG. 6F. The amorphous silicon film 506 may be replaced with a conductive polysilicon film or a conductive single-crystal silicon film. Then, the amorphous silicon film 506 is etched back and a side-wall film 506 is formed, as shown in FIG. 6G.

The resultant structure is heat-treated to repair defects in a gate end portion of the gate insulating film 502. This heat treatment should, preferably, be performed in a short time period. If the temperature for treatment is 950° C., or above, sufficient effect can be attained within several-ten seconds. The heat treatment may be performed after subsequent formation of a source/drain region.

Then, a source/drain region is formed in a self-alignment manner by means of ion implantation and the implanted ions are activated by a lamp annealing method. Subsequently, an interlayer insulating film, a metal wiring layer, etc. are formed in a subsequent step and a MOS type semiconductor device is fabricated.

As has been described above, in the method of manufacturing the MOS type semiconductor device according to the fourth embodiment, the tungsten silicide film 503 is covered with the silicon films 504 and 506 at the time of improving the shape of the lower end portion of the tungsten silicide film 503 and repairing defects in the gate end portion of the gate insulating film 502. Thus, the oxidizing agent does not substantially reach the surface of tungsten film 404 in a short time period and formation of a refractory metal oxide accompanied by degradation of a surface morphology is suppressed.

The method according to the fourth embodiment is also applicable to a case where a metallic material is used as gate electrode material. In this case, it is preferable that the oxidation is performed under such a selective oxidation condition that the rate of oxidation reaction on silicon is higher than that of reduction reaction thereon, and the rate of oxidation reaction on a metal is lower than that of reduction reaction thereon. In this case, too, formation of a refractory metal oxide accompanied by degradation of a surface morphology can be prevented because of a decrease in oxidation rate.

If the metallic material is used, the formation of the contact hole for contact with the gate electrode can be stopped by the conductive amorphous silicon film 504. Thereafter, a treatment using an acid solution can be performed.

Unlike the conventional technique, two-stage gate electrode patterning steps are not required, and thus the number of steps can be reduced. A transistor can be manufactured with minimum patterning dimensions, and high integration density can be achieved. A step of the total-surface etchback, with which dimensional controllability is low, is not required. Thus, a variance in operational characteristics of transistors due to a variance in dimensions is prevented.

Since the silicon nitride film is not used as oxidation prevention film, the reliability of the gate insulating film does not deteriorate due to stress, and degradation of operational characteristics of transistors can be prevented. In addition, penetration of boron present in the electrode into the semiconductor substrate, which is generally considered to be accelerated by hydrogen, can be suppressed, and variance in operational characteristics of transistors can be prevented.

As has been described above, according to the present invention, in the state in which an exposed surface of a metal film or a metal silicide film constituting a gate electrode is covered with a silicon film, a metal silicide film or a silicon oxide film, a heat treatment is performed to increase the radius of curvature of a lower end portion of the gate electrode or increase the thickness of a gate insulating film under the lower end portion of the gate electrode, and to repair defects in the gate insulating film. Thus, oxidation of the metal film or metal silicide film constituting the gate electrode, which is accompanied by degradation of a surface morphology, can be suppressed. Thereby, semiconductor devices with high performance and high reliability can be manufactured cost-effectively in a short time period with high yield.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

It is claimed:

1. A method of manufacturing a semiconductor device, the method comprising the steps of:

forming a gate insulating film and a first silicon film on a semiconductor substrate;

forming on the first silicon film a conductive film selected from the group consisting of a metal film and a metal silicide film;

patterning the conductive film and the first silicon film, thereby forming a gate electrode;

forming a second silicon film on a surface of the gate electrode; and carrying out a heat treatment for increasing the radius of curvature of a lower end portion of the gate electrode or increasing the thickness of the gate insulating film under the lower end portion of the gate electrode, and repairing defects in the gate insulating film.

2. The method according to claim 1, wherein the heat treatment is carried out at temperatures of 950° C. or above.

3. The method according to claim 1, wherein the heat treatment is carried out in an oxidizing atmosphere.

4. The method according to claim 1, wherein the heat treatment is carried out under such a selective oxidation condition that the rate of oxidation reaction with silicon is higher than that of reduction reaction therewith, and the rate of oxidation reaction with a metal is lower than that of reduction reaction therewith.

5. The method according to claim 1, further comprising a step of forming source and drain regions after the heat treatment.

6. The method according to claim 1, further comprising a step of forming source and drain regions before the heat treatment.

7. A method of manufacturing a semiconductor device, the method comprising the steps of:

forming a gate insulating film and a first silicon film on a semiconductor substrate;

forming on the first silicon film a conductive film selected from the group consisting of a metal film and a metal silicide film;

patterning the conductive film and the first silicon film, thereby forming a gate electrode;

forming a silicon oxide film on an exposed surface of the first silicon film of the gate electrode;

forming a second silicon film on a surface of the conductive film and a surface of the silicon oxide film; and carrying out a heat treatment for increasing the radius of curvature of a lower end portion of the gate electrode or increasing the thickness of the gate insulating film under the lower end portion of the gate electrode, and repairing defects in the gate insulating film.

8. The method according to claim 7, wherein said silicon oxide film is formed at temperatures of 600° C. or below.

9. The method according to claim 7, wherein that portion of the second silicon film, which is formed on a side wall of the metal film or metal silicide film constituting the gate electrode, is thicker than that of the other portion of the second silicon film.

10. The method according to claim 7, wherein the heat treatment is carried out at temperatures of 950° C. or above.

11. The method according to claim 7, wherein the heat treatment is carried out in an oxidizing atmosphere.

12. The method according to claim 7, wherein the heat treatment is carried out under such a selective oxidation condition that the rate of oxidation reaction with silicon is higher than that of reduction reaction therewith, and the rate of oxidation reaction with a metal is lower than that of reduction reaction therewith.

13. The method according to claim 7, further comprising a step of forming source and drain regions after the heat treatment.

14. The method according to claim 7, further comprising a step of forming source and drain regions before the heat treatment.

15. A method of manufacturing a semiconductor device, the method comprising the steps of:
   forming a gate insulating film and a first silicon film on a semiconductor substrate;
   forming on the first silicon film a conductive film selected from the group consisting of a metal film and a metal silicide film;
   forming on the conductive film a silicon oxide film or a metal silicide film;
   selectively etching the silicon oxide film or the metal silicide film, and the conductive film, thereby forming a gate electrode;
   forming a silicon oxide film or a metal silicide film on a side wall of the gate electrode;
   selectively etching the first silicon film by using the silicon oxide film or the metal silicide film as a mask; and
   carrying out a heat treatment for increasing the radius of curvature of a lower end portion of the gate electrode or increasing the thickness of the gate insulating film under the lower end portion of the gate electrode, and repairing defects in the gate insulating film.

16. The method according to claim 15, wherein the heat treatment is carried out at temperatures of 950° C. or above.

17. The method according to claim 15, wherein the heat treatment is carried out in an oxidizing atmosphere.

18. The method according to claim 15, wherein the heat treatment is carried out under such a selective oxidation condition that the rate of oxidation reaction with silicon is higher than that of reduction reaction therewith, and the rate of oxidation reaction with a metal is lower than that of reduction reaction thereon.

19. The method according to claim 15, further comprising a step of forming source and drain regions after the heat treatment.

20. The method according to claim 15, further comprising a step of forming source and drain regions before the heat treatment.

21. A method of manufacturing a semiconductor device, the method comprising the steps of:
   forming on a semiconductor substrate a gate insulating film and a conductive film containing a conductor selected from the group consisting of a metal and a metal silicide;
   patterning the conductive film, thereby forming a gate electrode;
   forming a silicon film on a surface of the gate electrode; and
   carrying out a heat treatment for increasing the radius of curvature of a lower end portion of the gate electrode or increasing the thickness of the gate insulating film under the lower end portion of the gate electrode, and repairing defects in the gate insulating film.

22. The method according to claim 21, further comprising a step of etching back the silicon film formed on the surface of the gate electrode and leaving a portion of the silicon film on a side wall of the gate electrode.

23. The method according to claim 21, wherein said conductive film comprises a single layer of a metal film or a metal silicide.

24. The method according to claim 21, wherein said conductive film comprises a metal film or a metal silicide film formed over the gate insulating film with a barrier layer interposed therebetween.

25. The method according to claim 21, wherein the heat treatment is carried out at temperatures of 950° C. or above.

26. The method according to claim 21, wherein the heat treatment is carried out in an oxidizing atmosphere.

27. The method according to claim 21, wherein the heat treatment is carried out under such a selective oxidation condition that the rate of oxidation reaction with silicon is higher than that of reduction reaction therewith, and the rate of oxidation reaction with a metal is lower than that of reduction reaction therewith.

28. The method according to claim 21, further comprising a step of forming source and drain regions after the heat treatment.

29. The method according to claim 21, further comprising a step of forming source and drain regions before the heat treatment.

* * * * *